(12) United States Patent
Asano et al.

(10) Patent No.: US 6,828,644 B2
(45) Date of Patent: Dec. 7, 2004

(54) SEMICONDUCTOR DEVICE WITH REDUCED PARASITIC CAPACITANCE BETWEEN IMPURITY DIFFUSION REGIONS

(75) Inventors: Yuji Asano, Kawasaki (JP); Morio Katou, Kawasaki (JP); Takao Setoyama, Kawasaki (JP); Toshihiko Fukushima, Nara (JP); Kazuhiro Natsuaki, Sakurai (JP)

(73) Assignees: Fujitsu Limited, Kawasaki (JP); Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/393,389

(22) Filed: Mar. 21, 2003

(65) Prior Publication Data

US 2003/0197190 A1 Oct. 23, 2003

(30) Foreign Application Priority Data

Mar. 22, 2002 (JP) ........................................ 2002-081041

(51) Int. Cl.[7] .............................................. H01L 31/06
(52) U.S. Cl. ...................... 257/461; 257/557; 257/577
(58) Field of Search ................................. 257/233, 293, 257/461, 462, 463, 557, 558, 559, 577, 594, 618

(56) References Cited

U.S. PATENT DOCUMENTS 5,500,550 A * 3/1996 Morishita .................... 257/461

6,229,194 B1 * 5/2001 Lizotte ........................ 257/506

FOREIGN PATENT DOCUMENTS

| JP | 62-86756 | 4/1987 |
|----|----------|--------|
| JP | 3-89550 | 4/1991 |
| JP | 7-45912 | 2/1995 |
| JP | 2000-156521 | 6/2000 |

* cited by examiner

Primary Examiner—Hoai Pham
(74) Attorney, Agent, or Firm—Westerman, Hattori, Daniels & Adrian, LLP

(57) ABSTRACT

A first layer is formed on an underlying substrate having a surface layer made of semiconductor of a first conductivity type. The first layer is made of semiconductor having a resistance higher than that of the surface layer. A first impurity diffusion region of a second conductivity type is formed in a partial surface region of the first layer. The first impurity diffusion region does not reach the surface of the underlying substrate. A second impurity diffusion region of the first conductivity type is disposed in the first layer and spaced apart from the first impurity diffusion region. The second impurity diffusion region reaches the surface of the underlying substrate. A separation region is disposed between the first and second impurity diffusion regions. The separation region comprises a trench formed in the first layer and dielectric material disposed at least in a partial internal region of the trench.

18 Claims, 15 Drawing Sheets

SEMICONDUCTOR DEVICE WITH REDUCED PARASITIC CAPACITANCE BETWEEN IMPURITY DIFFUSION REGIONS

CROSS REFERENCE TO RELATED APPLICATION

This application is based on Japanese Patent Application No. 2002-81041, filed on Mar. 22, 2002, the entire contents of which are incorporated herein by reference.

BACKGROUND OF THE INVENTION

A) Field of the Invention

The present invention relates to a semiconductor device, and more particularly to a semiconductor device with reduced parasitic capacitance between two adjacent impurity diffusion regions formed in a semiconductor substrate.

B) Description of the Related Art

FIG. 11A is a cross sectional view of a photodiode which is one kind of a photo sensor. On the surface of a p-type silicon substrate 100, an epitaxial layer 101 made of n-type silicon is formed. On the surface of the n-type epitaxial layer 101, a field oxide film 102 is formed to define a plurality of active regions.

In one active region (an active region in the central area of FIG. 11A), a plurality of n-type cathode regions 103 are formed mutually spaced apart by a certain distance. Between two adjacent cathode regions 103, a p-type separation region 104 is formed. The surface of the active region 104 in which the cathode regions 103 and separation region 104 are formed is covered with an antireflection film 105.

In each of the active regions (active regions on the right and left sides in FIG. 11A) adjacent to the active regions in which the cathode regions 103 are formed, a p-type anode lead region 106 is formed. The bottom of the anode lead region 106 reaches the p-type silicon substrate 100.

The cathode region 103 and p-type silicon substrate 100 constitute a photodiode. The p-type silicon substrate 100 functions as the anode of the photodiode.

Such photodiodes are widely used as an optical pickup device to be used with a photoelectric conversion device typically an optical disc such as a DVD and a CD, as a photo sensor having a photoelectric conversion function. A photo sensor to be used with an optical disc is desired to operate at high speed as the wavelength of a laser beam becomes shorter. In order to realize stable high-speed operation, it is desired to reduce various types of parasitic capacitances in the photo sensor and prevent leak currents.

The photo sensor shown in FIG. 11A has parasitic capacitances between the cathode region 103 and adjacent anode region 106, between the cathode region 103 and p-type silicon substrate 100 and between the cathode region 103 and separation region 104. These parasitic capacitances are desired to be reduced in order to ensure stable high-speed operation.

FIG. 11B is a cross sectional view of a conventional photo sensor whose parasitic capacitance is partially reduced. Between the cathode region 103 and anode lead region 106, a trench 108 is formed through the field oxide film 102, the trench reaching the surface layer of the p-type silicon substrate 100. A silicon oxide film is formed on the bottom and inner sidewalls of the trench 108, and polysilicon is filled in the trench 108.

A p-type high impurity concentration region 109 is formed in a region of the p-type silicon substrate 100 and n-type epitaxial layer 101 in contact with the trench 108. This p-type high impurity concentration region 109 prevents leak current from flowing via the bottom of the trench 108.

Since the thin silicon oxide film having a dielectric constant lower than that of silicon is formed on the sidewall of the trench 108, parasitic capacitance between the cathode region 103 and anode lead region 106 can be reduced.

Although the parasitic capacitance between the cathode region 103 and anode lead region 106 of the photo sensor shown in FIG. 11B can be reduced, the parasitic capacitances between the cathode region 103 and p-type silicon substrate 100 and between the cathode region 103 and separation region 104 cannot be reduced.

Since the p-type high impurity concentration region 109 is formed around the trench 108, parasitic capacitance is newly formed between the cathode region 103 and p-type high impurity concentration region 109.

SUMMARY OF THE INVENTION

An object of this invention is to provide a semiconductor device with reduced parasitic capacitance between two impurity diffusion regions having opposite conductivity types.

According to one aspect of the present invention, there is provided a semiconductor device comprising: an underlying substrate having at least a surface layer made of semiconductor of a first conductivity type; a first layer formed on or over the underlying layer and made of semiconductor having a resistance higher than a resistance of the surface layer of the underlying substrate; a first impurity diffusion region formed in a partial surface region of the first layer and doped with impurities of a second conductivity type opposite to the first conductivity type, the first impurity diffusion region not reaching a surface of the underlying substrate; a second impurity diffusion region of the second conductivity type disposed in the first layer and spaced apart from the first impurity diffusion region in an in-plane direction by a certain distance, the second impurity diffusion region reaching the surface of the underlying substrate; and a first separation region disposed between the first and second impurity diffusion regions and comprising a trench formed in the first layer and dielectric material disposed at least in a partial internal region of the trench.

The first layer having a high resistance is disposed between the first impurity diffusion region and underlying substrate. Parasitic capacitance between the first impurity diffusion region and underlying substrate can therefore be reduced. Since the dielectric material is disposed in the trench constituting the first separation region, parasitic capacitance between the first and second impurity diffusion regions can be reduced.

DESCRIPTION OF THE PREFERRED EMBODIMENTS

Figure 1:
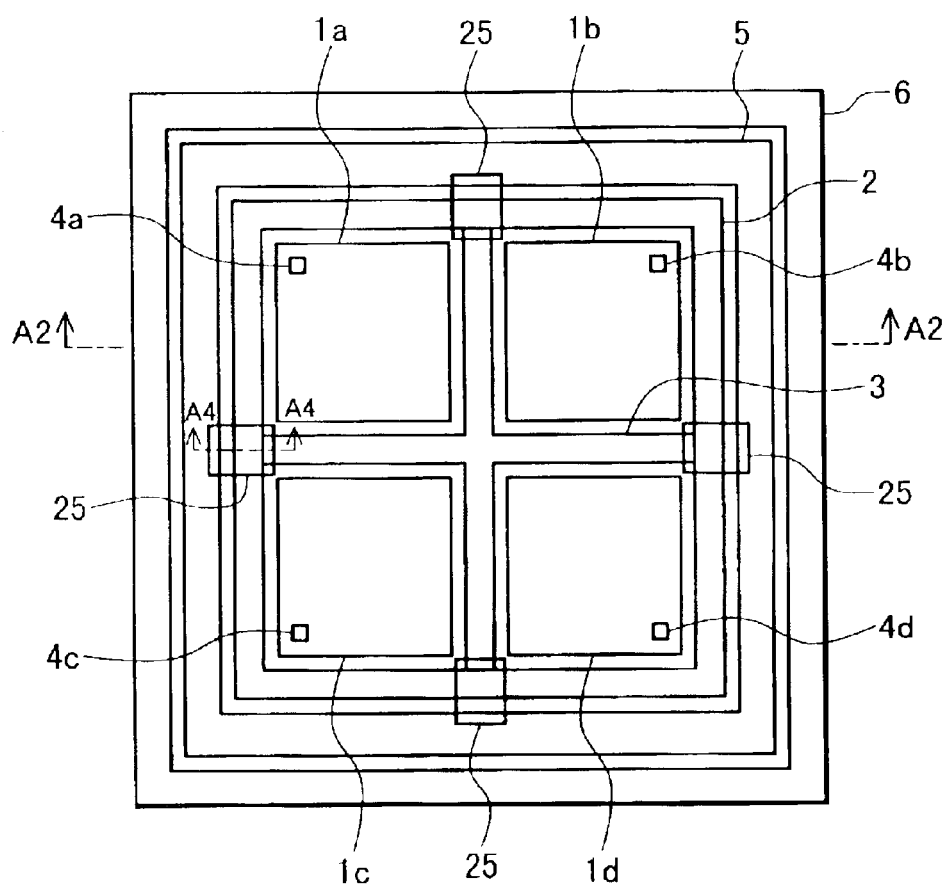
FIG. 1 is a plan view of a photo sensor according to a first embodiment.

FIG. 1 is a plan view of a semiconductor photo sensor according to the first embodiment of the invention. A trench 2 having a plan shape in conformity with the outer periphery of a square is disposed in the surface layer of a semiconductor substrate. A separation region 3 interconnects the centers of the opposing two sides of a square defined by the trench 2 to partition the inside of the trench 2 into four regions. The distal ends of the separation region 3 abut on the sidewall of the trench 2.

Cathode regions 1a to 1d are disposed in the four regions partitioned by the separation region 3. Each of the cathode regions 1a to 1d is disposed spaced apart from the trench 2 and separation region 3 by a certain distance. The surfaces of the cathode regions 1a to 1d and separation region 3 are covered with an antireflection film as will be later described. Electrode lead openings 4a to 4d are formed through the antireflection film in correspondence with and inside of the cathode regions 1a to 1d.

An anode lead region 5 surrounds the outside of the trench 2. Another trench 6 surrounds the outside of the anode lead region 5.

Figure 2:
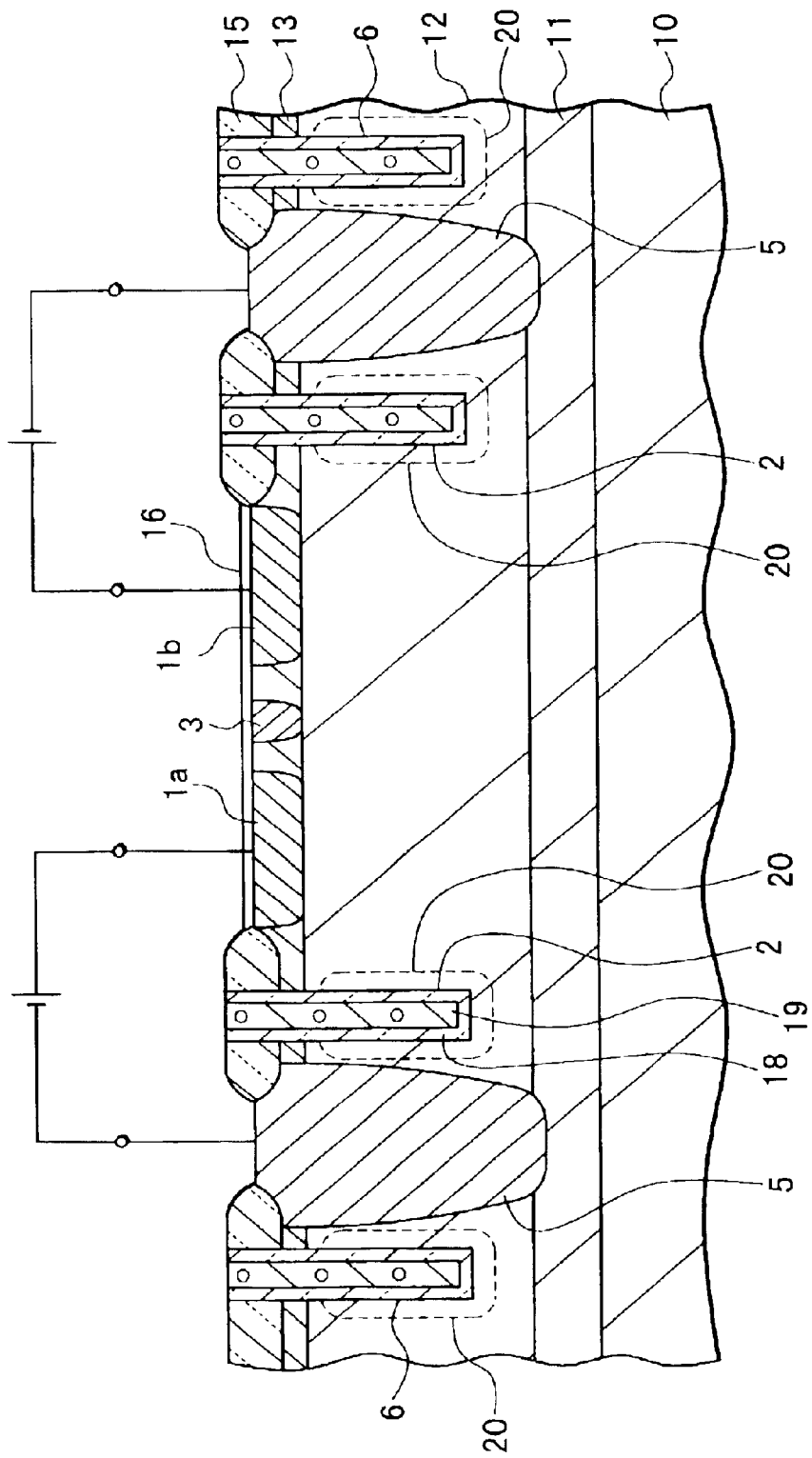
FIG. 2 is a cross sectional view of the photo sensor according to the first embodiment.

FIG. 2 is a cross sectional view taken along one-dot chain line A2—A2 shown in FIG. 1. In the surface layer of a p-type silicon substrate 10 having an impurity concentration of $1 \times 10^{14}$ to $1 \times 10^{18}$ cm$^{-3}$, p-type impurities are doped to form a p-type high impurity concentration layer 11 having a peak concentration of about $1 \times 10^{17}$ cm$^{-3}$. On this p-type high impurity concentration layer 11, a p-type epitaxial layer 12 is formed which has a thickness of about 10 to 20 µm and a p-type impurity concentration equal to or lower than $1 \times 10^{14}$ cm$^{-3}$ on its upper surface side. On the p-type epitaxial layer 12, an n-type epitaxial layer 13 is formed having an impurity concentration of about $5 \times 10^{15}$ cm$^{-3}$ and a thickness of 0.8 to 2 µm.

On the surface of the n-type epitaxial layer 13, a field oxide film 15 is formed to define a plurality of active regions.

In the n-type epitaxial layer 13 in the central active region shown in FIG. 2, the n-type cathode regions 1a and 1b are formed. Although not drawn in FIG. 2, the cathode regions 1c and 1d are also formed in this active region. The cathode regions 1a–1d are n-type impurity diffusion regions doped with phosphorous and have an impurity concentration of $1 \times 10^{15}$ to $1 \times 10^{20}$ cm$^{-3}$. The cathode regions 1a to 1d reach the upper surface of the p-type epitaxial layer 12. The structure that the cathode regions 1a to 1d do not reach the upper surface of the p-type epitaxial layer 12 may also be applied.

In the n-type epitaxial layer 13 between the cathode regions 1a and 1b, the separation region 3 is formed. The separation region 3 is a p-type impurity diffusion region doped with boron and has an impurity concentration of $1 \times 10^{16}$ to $1 \times 10^{20}$ cm$^{-3}$. The separation region 3 electrically separates the cathode regions 1a and 1b and prevents leak current from flowing therebetween.

It is preferable that the depth of the separation region 3 is made equal to or shallower than that of the cathode regions 1a–1d. The antireflection film 16 is formed on the surface of the active regions in which the cathode regions 1a and 1b are formed. The antireflection film 16 has the two-layer structure of a silicon oxide film and a silicon nitride film to lower the reflectivity relative to light in the reception wavelength range.

The anode lead regions 5 are formed in the active regions adjacent to the active regions in which the cathode regions 1a and 1b are formed. The anode lead region 5 is a p-type impurity diffusion region doped with boron and has an impurity concentration of $1 \times 10^{16}$ to $1 \times 10^{20}$ cm$^{-3}$. The anode lead region 5 extends from the upper surface of the n-type epitaxial layer 13 to the p-type high impurity concentration layer 11. As will be later described, the anode lead region 5 is formed by two ion implantation processes, one before forming the n-type epitaxial layer 13 and the other after forming the n-type epitaxial layer 13.

A reverse bias voltage is applied between the cathode region 1a and anode lead region 5 and between the cathode region 1b and anode lead region 5.

The trench 2 is formed between the active regions in which the cathode regions 1a and 1b are disposed and the active region in which the anode lead region 5 is disposed. The other trench 6 is formed to surround the anode lead region 5 together with the trench 2. The trenches 2 and 6 extend to the depth slightly shallower than the boundary between the p-type high impurity concentration layer 11 and p-type epitaxial layer 12 and have a width of about 1 µm. A silicon oxide film 18 having a thickness of about 0.3 µm is formed on the bottom and inner sidewalls of the trenches 2 and 6. A filler 19 of polysilicon is buried in the trenches 2 and 6.

A channel stopper diffusion region 20 highly doped with boron is formed in a partial region of the p-type epitaxial layer 12 contacting the trenches 2 and 6. The n-channel stopper diffusion region 20 has a boron impurity concentration of $1 \times 10^{16}$ to $1 \times 10^{18}$ cm$^{-3}$. The n-channel stopper diffusion region 20 reduces leak current flowing along the bottom and sidewall of the trench 2.

Figure 11A:
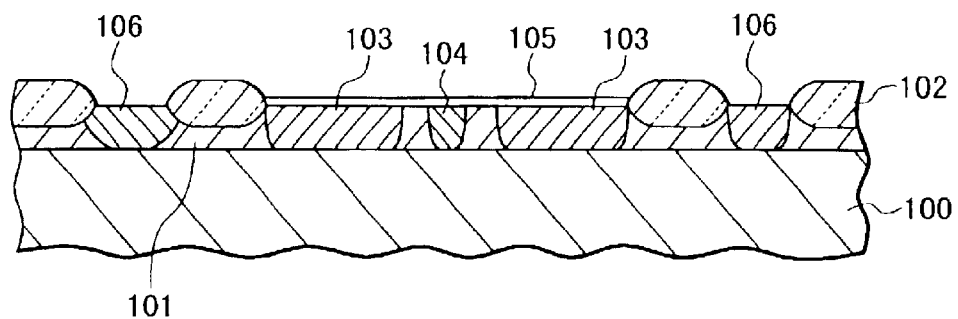
FIGS. 11A and 11B are cross sectional views of conventional photo sensors.
Figure 11B:
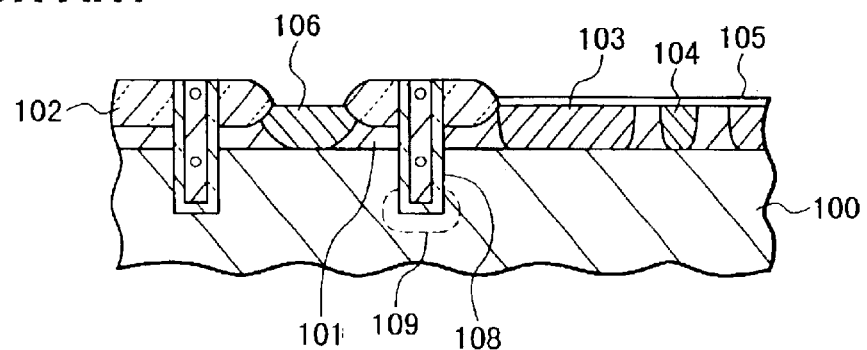

In the photo sensor of the first embodiment described above, photodiodes are constituted of the p-type epitaxial layer 12 and p-type high impurity concentration layer 11 as the anode and the cathode regions 1a and 1b as the cathodes. The p-type epitaxial layer 12 having a high resistance is disposed between the cathode region 1a and p-type high impurity concentration region 11. Parasitic capacitance between the cathode and anode can therefore be reduced more than the conventional photo sensor shown in FIGS. 11A and 11B in which the cathode region 103 and the p-type substrate (anode) 100 contact directly.

The trench 2 is disposed between the cathode region 1a and anode lead region 5. Since the dielectric constant of the silicon oxide film 18 disposed in the trench 2 is lower than that of silicon, parasitic capacitance therebetween can be reduced. The trench 2 is disposed spaced apart from the anode lead region 5 by a certain distance in the substrate in-plane direction. Therefore, parasitic reduction effects can be enhanced. Instead of the silicon oxide film, other films may be used which are made of dielectric material having a dielectric constant lower than that of silicon.

Figure 3:
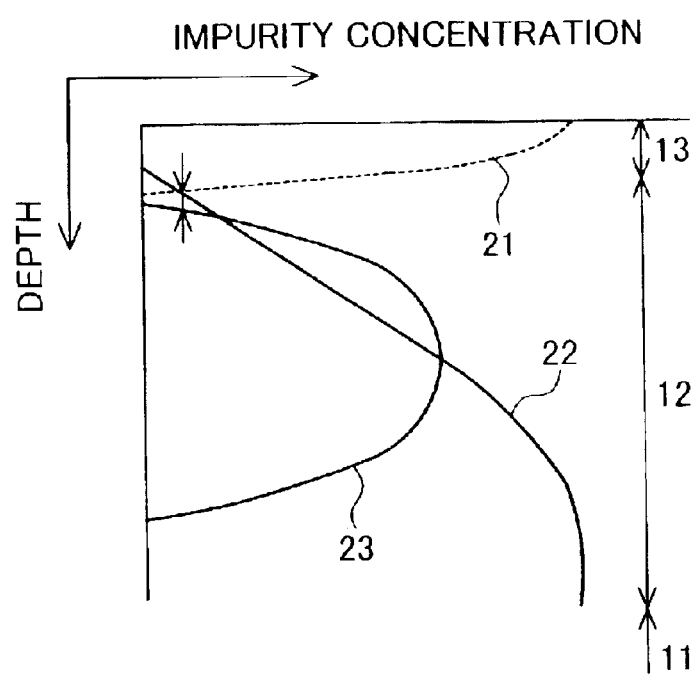
FIG. 3 is a graph showing an impurity concentration distribution along a depth direction at the side of a trench of the photo sensor of the first embodiment.

FIG. 3 is a graph showing an impurity concentration distribution along a depth direction at the side of the trench 2 shown in FIG. 2. The abscissa represents an impurity concentration and the ordinate represents a depth. A broken line 21 indicates the concentration of n-type impurities doped when the n-type epitaxial layer 13 is formed. A solid line 22 indicates the concentration of p-type impurities doped when the p-type epitaxial layer 12 is formed. A solid line 23 indicates the concentration of p-type impurities doped when the n-channel stopper diffusion region 20 is formed.

A cross point between the broken line 21 and solid line 22 corresponds to an interface between the n-type epitaxial layer 13 and p-type epitaxial layer 12. The p-type impurities doped to form the n-channel stopper diffusion region 20 are left in the p-type epitaxial layer 12 and do not diffuse into the n-type epitaxial layer 13. Namely, the n-channel stopper diffusion region 20 is disposed spaced apart from the n-type epitaxial layer 13 by a certain distance in the depth direction, and formed in the p-type epitaxial layer 12. As a result, an increase in parasitic capacitance between the cathode region 1a and n-channel stopper diffusion region 20 can be suppressed.

The trench 2 may be made deeper to dispose the n-channel stopper diffusion region 20 only near at the bottom of the trench 2. With this structure, parasitic capacitance between the cathode region 1a and n-channel stopper diffusion region 20 can be reduced further. To realize this structure, the trench 2 shown in FIG. 2 may be made deeper than the trench 6.

Reverting to FIG. 1, an n-channel stopper diffusion region 25 is disposed in an area including the interface between the separation region 3 and trench 2.

Figure 4:
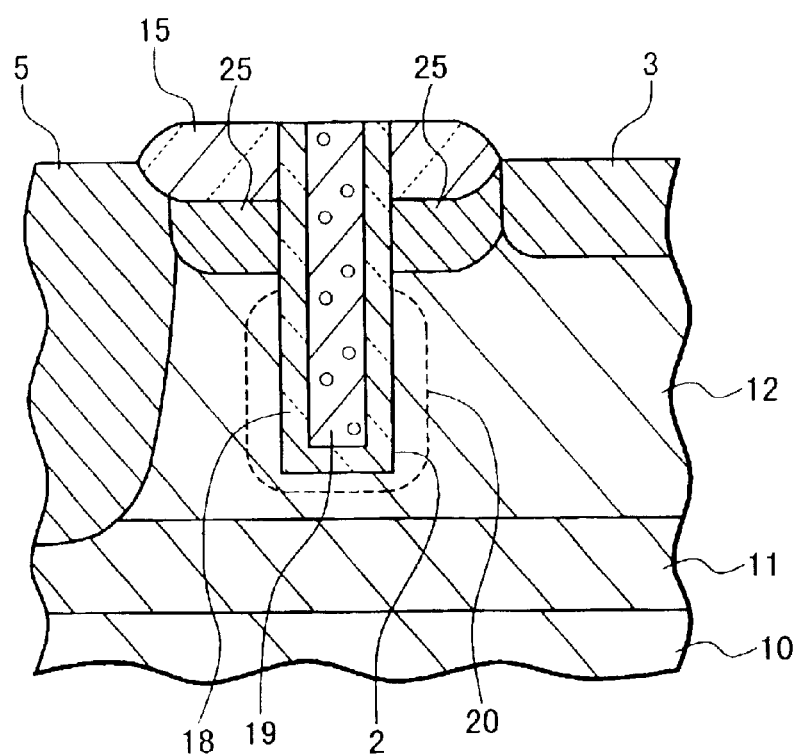
FIG. 4 is a cross sectional view showing a junction area between the trench and a separation region of the photo sensor of the first embodiment.

FIG. 4 is a cross sectional view taken along one-dot chain line A4—A4 shown in FIG. 1. The separation region 3 is disposed in the active region and does not extend under the field oxide film 15. The n-channel stopper diffusion region 25 is disposed under the field oxide film 15 between the separation region 3 and trench 2. The n-channel stopper diffusion region 25 is a p-type impurity diffusion region doped with boron and has an impurity concentration of about $1 \times 10^{17}$ cm$^{-3}$.

The n-channel stopper diffusion region 25 can reduce leak current flowing between adjacent cathode regions, e.g., cathode regions 1a and 1b, via the side area of the trench 2 shown in FIG. 1.

Figure 5:
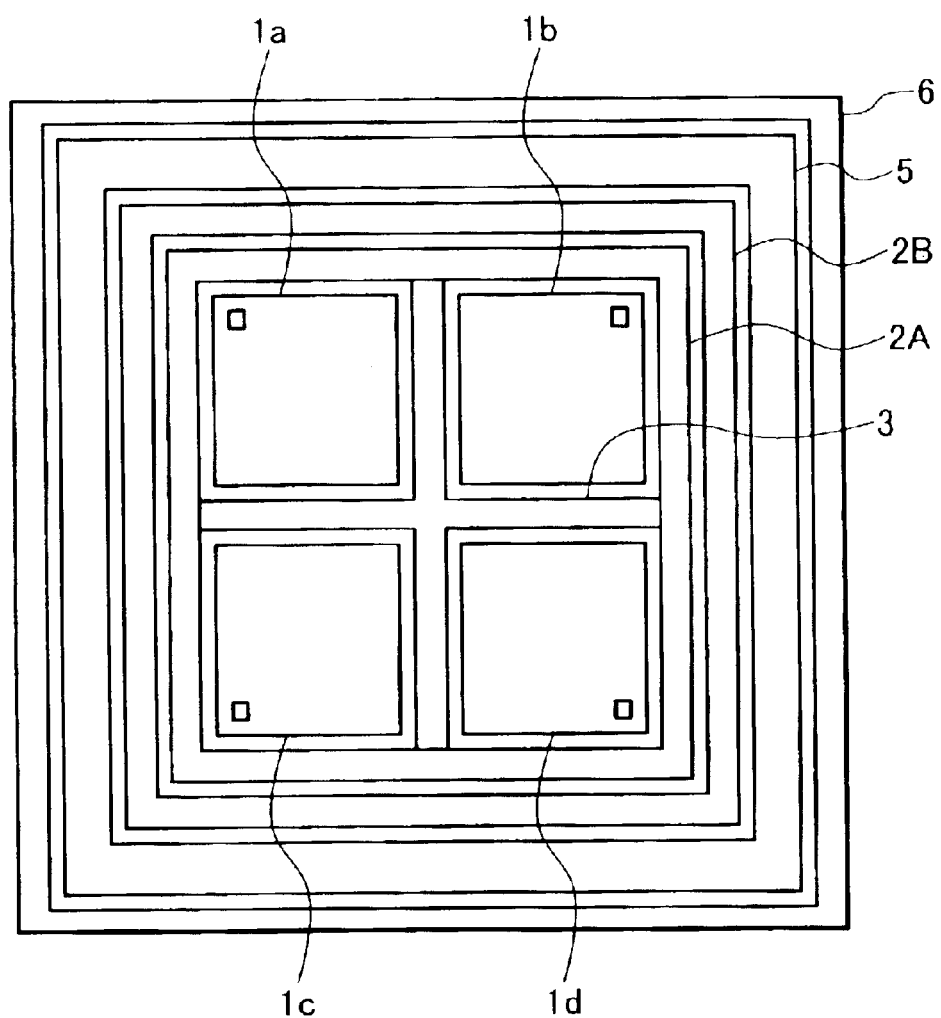
FIG. 5 is a plan view of a photo sensor according to a second embodiment.

FIG. 5 is a plan view of a photo sensor according to the second embodiment. In the first embodiment shown in FIG. 1, the trench 2 is singularly disposed between the cathode regions 1a–1d and anode lead region 5, whereas in the second embodiment, double trenches 2A and 2B are disposed. Namely, two trenches are disposed along a direction of separating the cathode regions 1a–1d and anode lead region 5. The other structures are the same as those of the photo sensor of the first embodiment.

By disposing two trenches, parasitic capacitance between the cathode regions 1a–1d and anode lead region 5 can be reduced further. Three or more trenches may be disposed.

Figure 6:
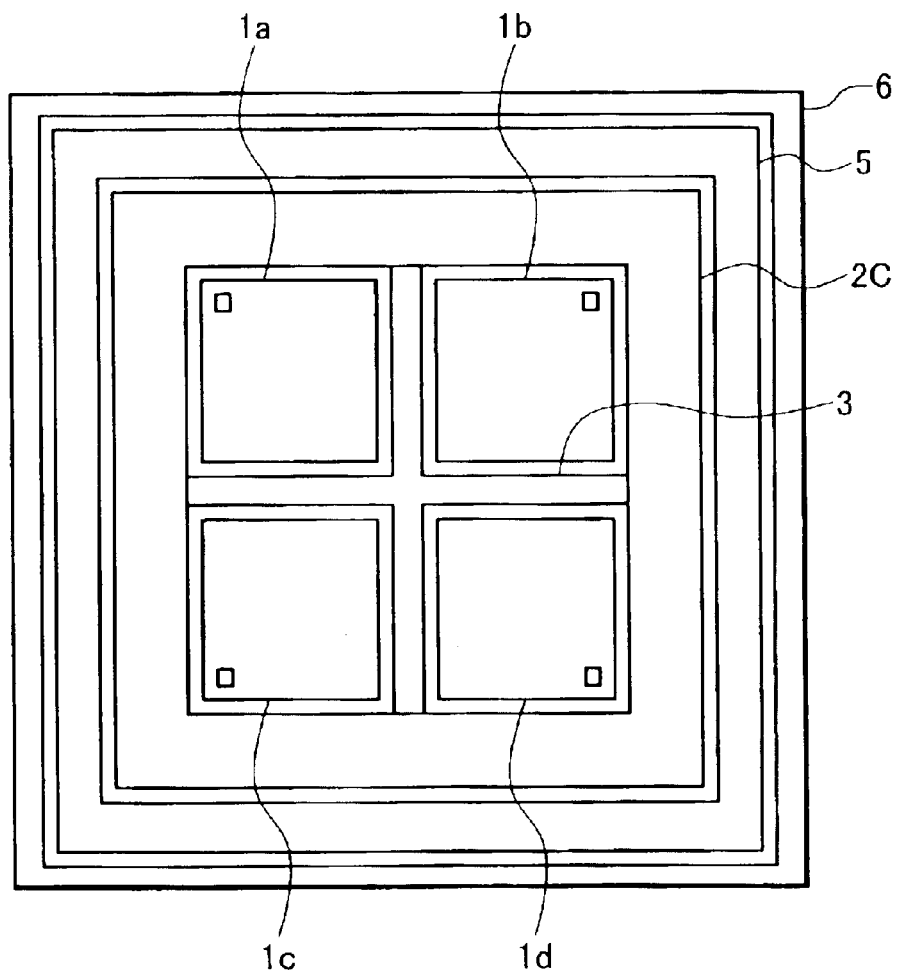
FIG. 6 is a plan view of a photo sensor according to a third embodiment.

FIG. 6 is a plan view of a photo sensor according to the third embodiment. In the first embodiment shown in FIG. 1, the width of the trench 2 is about 1 μm, whereas in the third embodiment, the width of a trench 2C disposed between the cathode regions 1a–1d and anode lead region 5 is made wider. The distance between the cathode regions 1a–1d and anode lead region 5 is therefore longer than that of the photo sensor of the first embodiment.

The other structures are the same as those of the photo sensor of the first embodiment shown in FIG. 1. Namely, the width of the trench 6 surrounding the outer periphery of the anode lead region 5 is the same as that of the trench 6 of the photo sensor of the first embodiment.

By broadening the width of the trench 2C wider than that of the trench 2 of the first embodiment, parasitic capacitance between the cathode regions 1a–1d and anode lead region 5 can be reduced. If the silicon oxide film formed on the bottom and inner sidewall of the trench 2C is made thicker, parasitic capacitance reduction effects can further be enhanced. A silicon oxide film may be filled in the whole inner space of the trench 2C.

Figure 7:
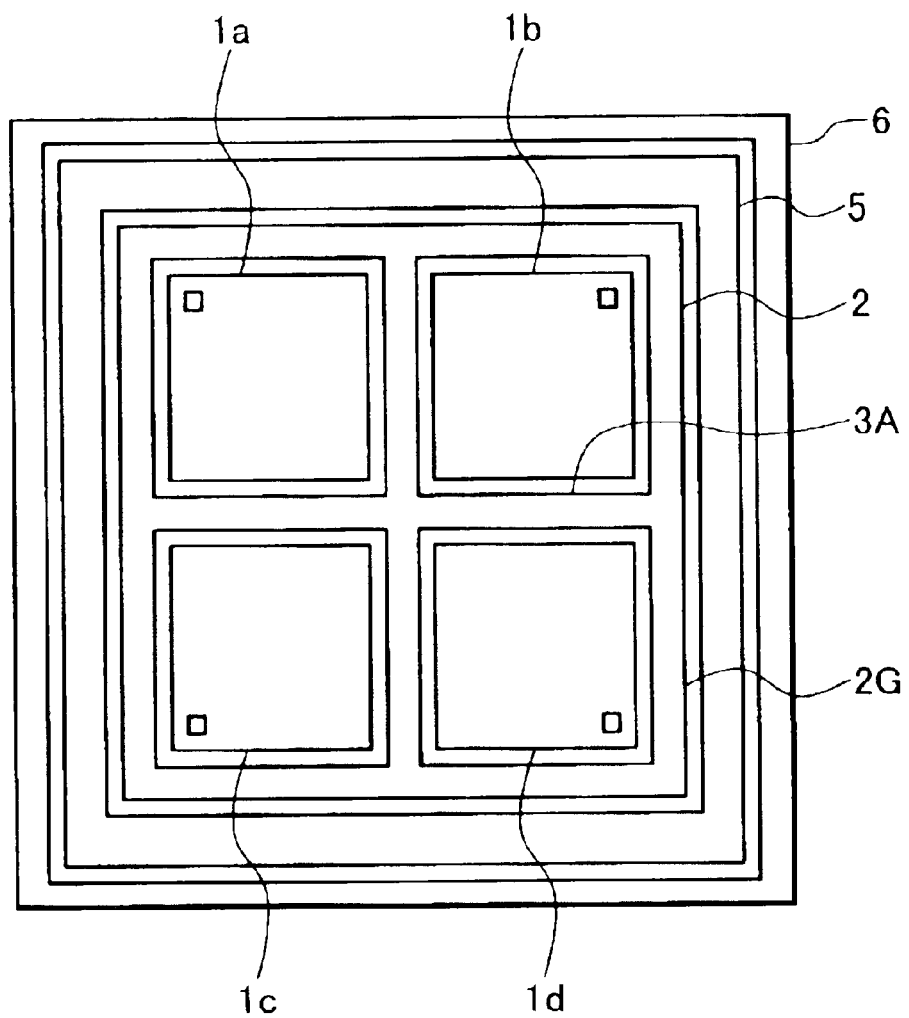
FIG. 7 is a plan view of a photo sensor according to a fourth embodiment.

FIG. 7 is a plan view of a photo sensor according to the fourth embodiment. In the photo sensor of the first embodiment shown in FIG. 1, the separation region 3 is the p-type impurity diffusion region as shown in FIG. 2, whereas in the fourth embodiment, a separation region 3A is constituted of a trench and a filler filled in the trench. A trench constituting the separation region 3A is branched from the trench 2 disposed between the cathode regions 1a–1d and anode lead region 5. By using the separation region 3A of the trench structure, parasitic capacitance between the cathode regions 1a–1d and separation region 3 of the first embodiment can be reduced.

Figure 8:
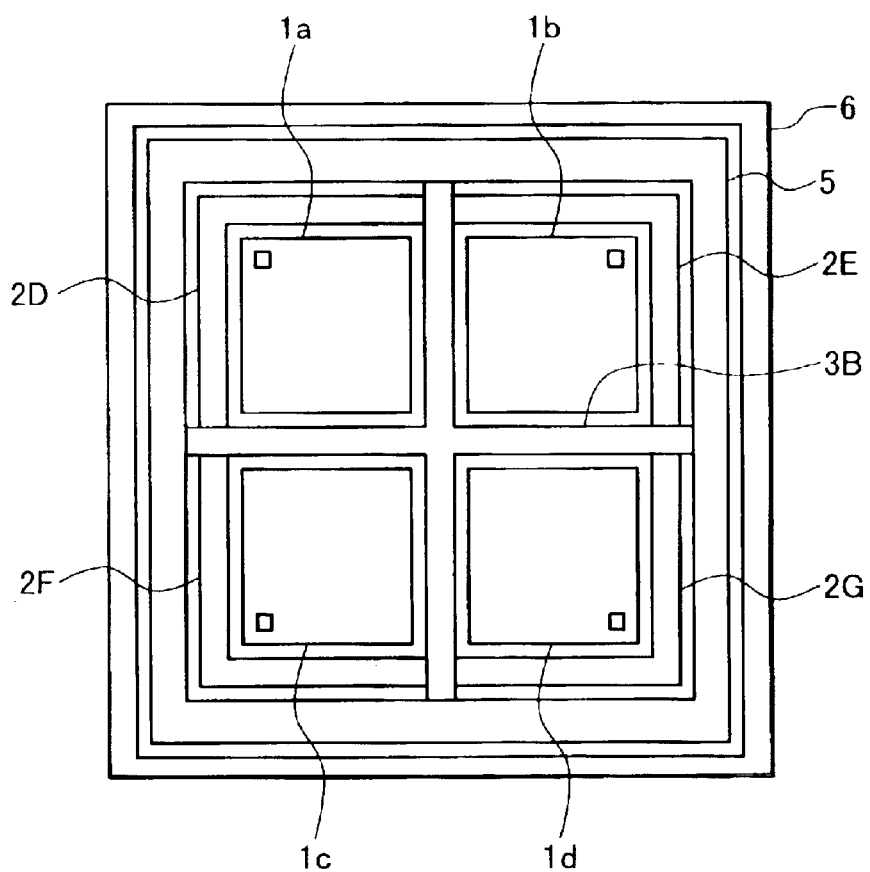
FIG. 8 is a plan view of a photo sensor according to a fifth embodiment.

FIG. 8 is a plan view of a photo sensor according to the fifth embodiment. In the first embodiment shown in FIG. 1, the trench 2 disposed between the cathode region 1a and anode lead region 5 is continuous with the trench 2 disposed between the adjacent cathode region 1b and anode lead region 5, and the distal end of the separation region 3 abuts on the side wall of the trench 2.

In the fifth embodiment, a separation region 3B between two adjacent cathode regions, e.g., cathode regions 1a and 1b, reaches the anode lead region 5. Namely, the distal end of the separation region 3B abuts on the sidewall of the anode lead region 5. Therefore, a trench 2D between the cathode region 1a and anode lead region 5 and a trench 2E between the cathode region 1b and anode lead region 5 are separated by the separation region 3B.

The distal ends of the trenches 2D and 2E abut on the sidewall of the separation region 3B. A trench 2F between the cathode region 1c and anode lead region 5 and a trench 2G between the cathode region 1d and anode lead region 5 have the structure same as that of the trenches 2D and 2E. The other structures are the same as those of the photo sensor of the first embodiment.

In the first embodiment, leak current may flow between the cathode regions 1a and 1b via the side area of the trench 2. In the fifth embodiment, the trench 2D between the cathode region 1a and anode lead region 5 and the trench 2E between the cathode region 1b and anode lead region 5 are separated by the separation region 3B. It is therefore possible to prevent leak current from flowing along the side area of the trench 2.

Figure 9:
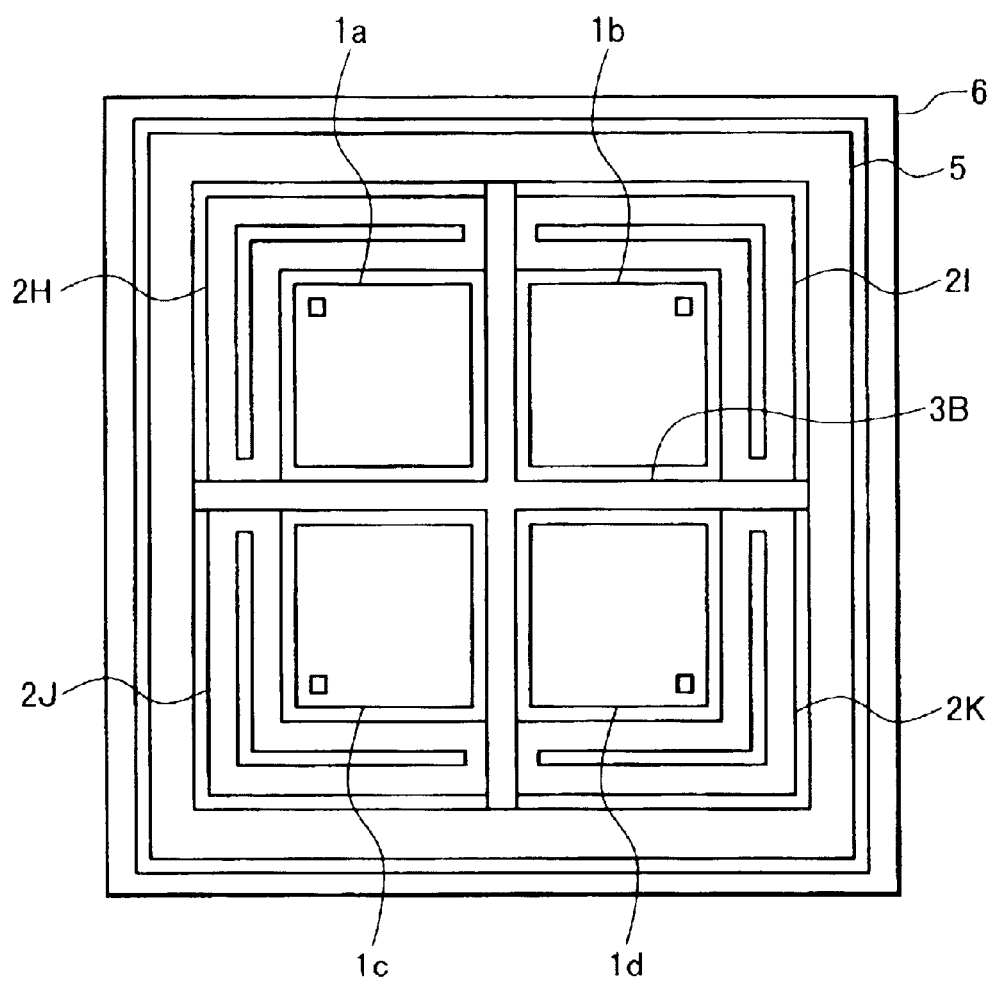
FIG. 9 is a plan view of a photo sensor according to a sixth embodiment.

FIG. 9 is a plan view of a photo sensor according to the sixth embodiment. In the fifth embodiment shown in FIG. 8, the trench 2D is singularly disposed between the cathode region 1a and anode lead region 5, whereas in the sixth embodiment, a trench 2H corresponding to the trench 2D of the fifth embodiment has a duplicate structure along the direction of separating the cathode region 1a and anode lead region 5. Other trenches 2I, 2J and 2K have also the duplicate structure. The other structures are the same as those of the photo sensor of the fifth embodiment shown in FIG. 8.

Figure 10A:
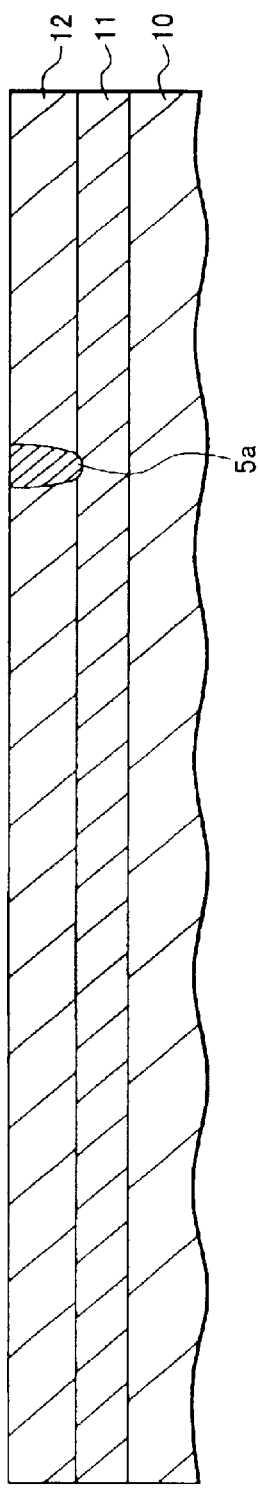
FIGS. 10A to 10G are cross sectional views illustrating a method of manufacturing a semiconductor device with the photo sensor of the first embodiment integrated with bipolar transistors.

By making the trench 2D disposed between the cathode region 1a and anode lead region 5 have the duplicate structure, parasitic capacitance between these regions 1a and 5 can be reduced. Next, with reference to FIGS. 10A to 10G, a method of manufacturing the photo sensor of the first embodiment will be described. In the method to be described below, bipolar transistors for amplifying photocurrent generated by the photo sensor are formed at the same time on the same substrate as that of the photo sensor. As show in FIG. 10A, boron ions are implanted into the surface layer of a p-type silicon substrate 10 having a resistivity of about 40 Ω·cm to thereby form a p-type high impurity concentration layer 11 having the surface impurity concentration of about $1\times10^{19}$ $cm^{-3}$. On this p-type high impurity concentration layer 11, a high resistance p-type epitaxial layer 12 is formed by chemical vapor deposition (CVD), the layer having a surface impurity concentration of about $1\times10^{14}$ $cm^{-3}$.

Boron ions are implanted into a partial region of the p-type epitaxial layer 12 to form an anode lead buried region 5a. The anode lead buried region 5a reaches the p-type high impurity concentration layer 11 and corresponds to the anode lead region 5 shown in FIG. 2 in the p-type epitaxial layer 12. The anode lead buried region 5a has an impurity concentration of $1\times10^{16}$ to $1\times10^{18}$ $cm^{-3}$.

Figure 10B:
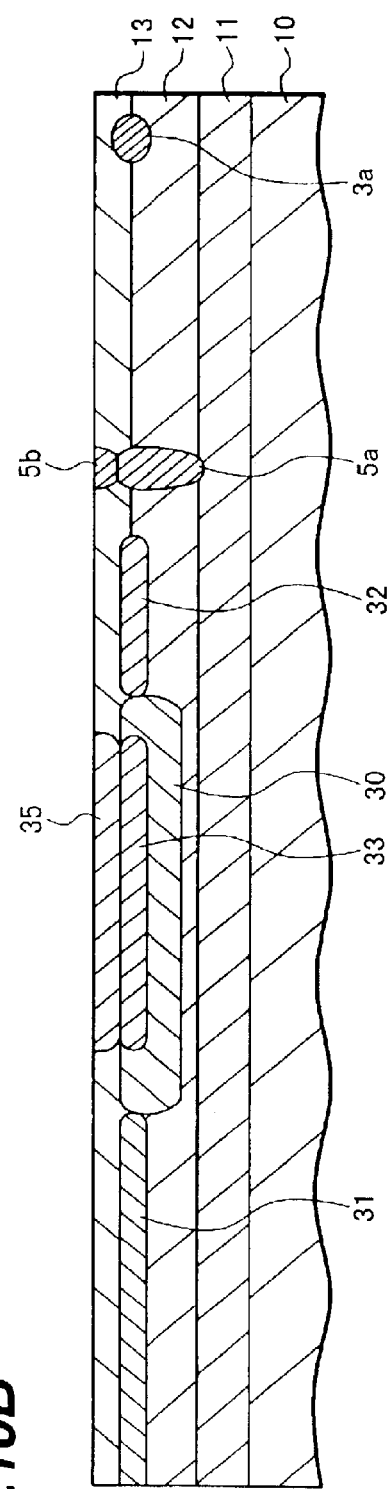

As shown in FIG. 10B, phosphorous ions are implanted in a partial region of the p-type epitaxial layer 12 to form an n-type p-channel stopper diffusion region 30. The p-channel stopper diffusion region 30 is disposed in the p-type epitaxial layer 12 and does not reach the p-type high impurity concentration layer 11. The phosphorous concentration in the p-channel stopper region 30 is $1\times10^{16}$ to $1\times10^{18}$ $cm^{-3}$. The phosphorous concentration is controlled so that a sufficient breakdown voltage is ensured between the p-type high impurity concentration layer 11 and p-channel stopper diffusion region 30 and between the collector region of a pnp transistor to be formed in the p-channel stopper diffusion region 30 and the p-channel stopper diffusion region 30.

Next, antimony ions are implanted into a partial region of the p-type epitaxial layer 12 to form an n-type buried diffusion region 31. At the same time, an n-type buried diffusion region 32 continuous with the p-channel stopper diffusion region 30 is formed. The antimony concentration of the n-type buried diffusion regions 31 and 32 is $1\times10^{18}$ to $1\times10^{20}$ $cm^{-3}$.

Boron ions are implanted into a partial region of the surface layer of the p-channel stopper diffusion region 30 to form a p-type buried diffusion region 33. At the same time, boron ions are implanted into a region corresponding to the separation region 3 shown in FIG. 1 to form a lower separation region. The boron concentration of the p-type buried diffusion region 33 and lower separation region 3a is $1\times10^{16}$ to $1\times10^{18}$ $cm^{3}$.

On the p-type epitaxial layer 12, an n-type epitaxial layer 13 is formed by CVD to a thickness of 0.8 to 2 μm. An n-type impurity concentration of the n-type epitaxial layer 13 is about $5\times10^{15}$ $cm^{-3}$.

Figure 10C:
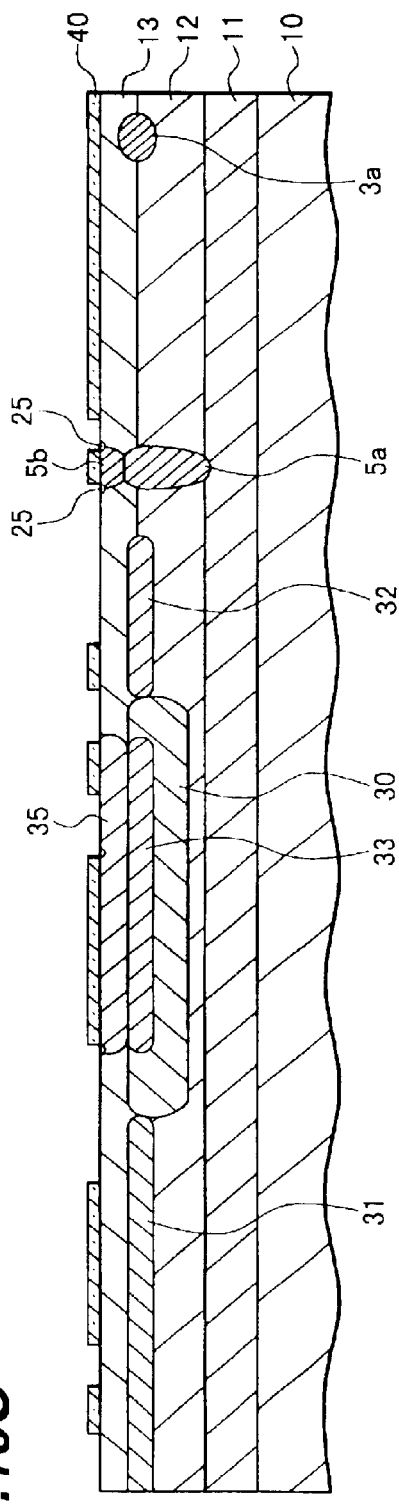

Boron ions are implanted into a partial region of the n-type epitaxial layer 13 in contact with the p-type buried diffusion region 33 to form a p-type well 35. At the same time, boron ions are implanted into a partial region of the n-type epitaxial layer 13 in contact with the anode lead buried region 5a to form an upper anode lead region 5b. The boron concentration of the p-type well 35 and upper anode lead region 5b is $1\times10^{16}$ to $1\times10^1$ $cm^{-3}$. The anode lead buried region 5a and upper anode lead region 5b constitute the anode lead region 5 shown in FIG. 2. As shown in FIG. 10C, on the surface of the n-type epitaxial layer 13, a mask pattern 40 for local oxidation of silicon (LOCOS) is formed. The mask pattern 40 has a two-layer structure of a silicon oxide film and a silicon nitride film.

Boron ions are implanted into the area where the n-channel stopper diffusion region 25 shown in FIG. 1 is formed. The boron concentration of the n-channel stopper diffusion region 25 is about $1\times10^{17}$ $cm^{-3}$. Since boron ions are implanted before LOCOS, the n-channel stopper diffusion region 25 is also disposed under the field oxide film to be formed at a later process.

Figure 10D:
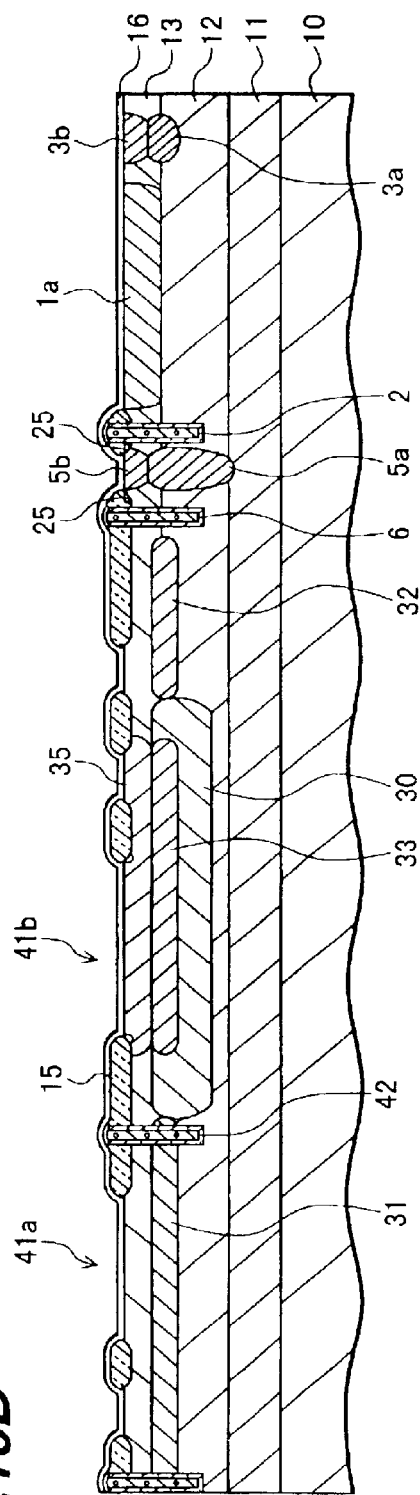

By using the mask pattern 40 as a mask, the surface of the n-type epitaxial layer 13 is locally oxidized. As shown in FIG. 10D, a field oxide film 15 is therefore formed and active regions are defined. The thickness of the field oxide film 15 is about 600 nm. Next, the trenches 2 and 6 shown in FIG. 1 are formed. At the same time, a trench 42 is formed in the boundary area between the active region 41b where a pnp transistor is disposed and the active region 41a where an npn transistor is disposed.

After the trenches are formed, boron ions are implanted to form the n-channel stopper diffusion region 20 shown in FIG. 2. The boron concentration is $1\times10^{16}$ to $1\times10^{18}$ $cm^{-3}$.

A silicon oxide film is formed covering the inner surface of the trenches 2, 6 and 42 and the substrate surface. A polysilicon film is formed burying the inside of the trenches 2, 6 and 42. The silicon oxide film and polysilicon film are etched back to leave the silicon oxide film and polysilicon film only in the trenches. A silicon oxide film is formed over the whole surface of the substrate to cover the upper surface of the polysilicon film in the trenches with the silicon oxide film.

An antireflection film 16 is formed over the whole surface of the substrate. The antireflection film 16 has a two-layer structure of a silicon oxide film and a silicon nitride film. These layers are formed, for example, by thermal oxidation and CVD. Boron ions are implanted into the n-type epitaxial layer 13 above the lower separation region 3a to form an upper separation region 3b. The boron concentration is $1\times10^{16}$ to $1\times10^{20}$ $cm^{-3}$. The lower separation region 3a and upper separation region 3b constitute the separation region 3 shown in FIG. 2.

Next, phosphorous ions are implanted to form a cathode region 1a. The phosphorous concentration is $1\times10^{15}$ to $1\times10^{20}$ $cm^{-3}$. Arsenic or antimony may be used instead of phosphorous. The impurity concentration of the separation region 3 and cathode region 1a is properly determined by considering the sensitivity and response speed of a photodiode.

Figure 10E:
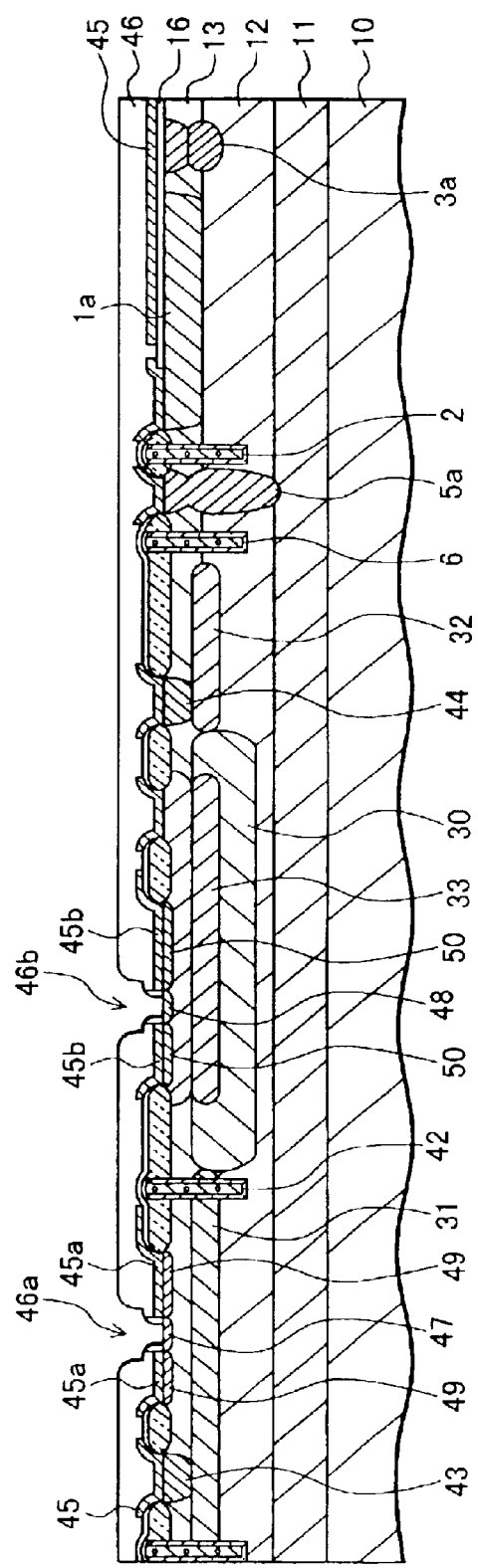

Processes up to the structure shown in FIG. 10E will be described. An opening is formed through the antireflection film 16 at the position where an electrode is formed. A first layer polysilicon film is formed over the whole substrate surface to a thickness of about 300 nm. This polysilicon film is patterned to leave a first layer polysilicon film 45 which covers the opening formed through the antireflection film 16. The polysilicon film 45 is also left on the antireflection film 16 which covers the surface of the cathode region 1a.

Phosphorous ions are implanted into the collector region 43 of the npn transistor via the polysilicon film 45. The phosphorous concentration is about $1\times10^{19}$ $cm^{-3}$. The collector region 43 reaches the n-type buried diffusion region 31. At the same time, an n-type lead region 44 is formed reaching the n-type buried diffusion region 32.

Boron ions for forming an external base are implanted into the polysilicon film 45a covering the active region in which the npn transistor is disposed. Phosphorous ions for forming an external base are implanted into the polysilicon film 45b covering the active region in which the pnp transistor is disposed. The boron and phosphorous concentration is about $1 \times 10^{19}$ cm$^{-3}$.

An interlayer insulating film 46 made of silicon oxide is formed over the whole surface of the substrate. Emitter windows 46a and 46b are formed through the interlayer insulating film 46. Ions are implanted via the emitter windows to laterally connect the inter and outer bases. Sidewall spacers are formed on the inner sidewalls of the emitter windows 46a and 46b.

Next, ions for forming an inner base are implanted via the emitter windows 46a and 46b into the surface layer of the n-type epitaxial layer 13. Boron ions are implanted into the inner base 47 of the npn transistor, and phosphorous ions are implanted into the inner base 48 of the pnp transistor. The boron and phosphorous concentration is about $1 \times 10^{18}$ cm$^{-3}$.

After ions are implanted, an annealing process is performed. With this annealing process, boron ions in the polysilicon film 45a diffuse into the surface layer of the n-type epitaxial layer 13 to form an outer base 49. Similarly, phosphorous ions in the polysilicon film 45b diffuse into the surface layer of the p-type well 35 to form an outer base 50.

Figure 10F:
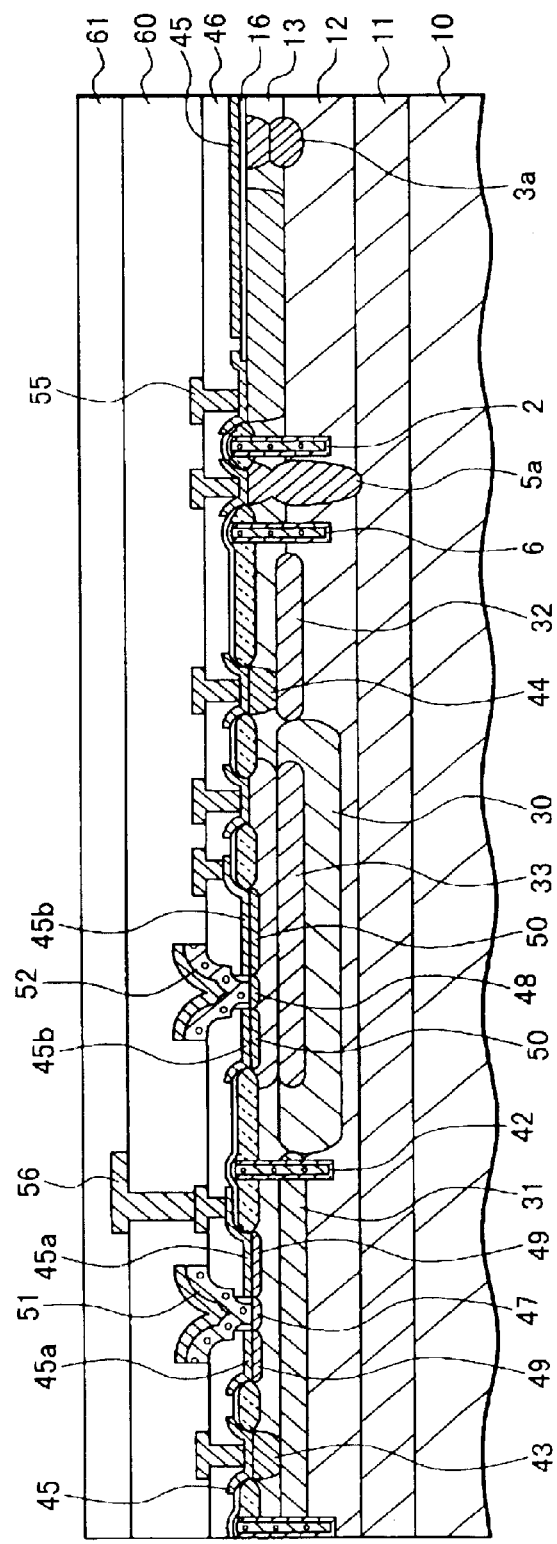

As shown in FIG. 10F, a second layer polysilicon film is formed on the interlayer insulating film 46. Phosphorous ions are implanted into a partial region of the polysilicon film where the npn transistor is disposed, and boron ions are implanted into a partial region where the pnp transistor is disposed. The phosphorous and boron concentration is $1 \times 10^{19}$ to $1 \times 10^{20}$ cm$^{-3}$. The polysilicon film is patterned to leave emitters 51 and 52 made of polysilicon in the emitter windows 46a and 46b. Impurities in the emitters 51 and 52 are diffused by an annealing process into the surface layer of the n-type epitaxial layer 13.

Openings are formed through the interlayer insulating film 46 in order to form lead electrodes for the collector, base and emitter of a transistor, the cathode and anode of a photodiode and the like. A first layer aluminum electrode 55 is formed in these openings. On the first layer interlayer insulating film 46, a second layer interlayer insulating film 60 made of silicon oxide is formed. An opening is formed through the second layer interlayer insulating film in order to form a lead electrode for the base of the npn transistor. A second layer aluminum electrode 56 is formed in this opening. A cover film 61 made of silicate glass and silicon nitride is formed on the second interlayer insulating film 60.

Figure 10G:
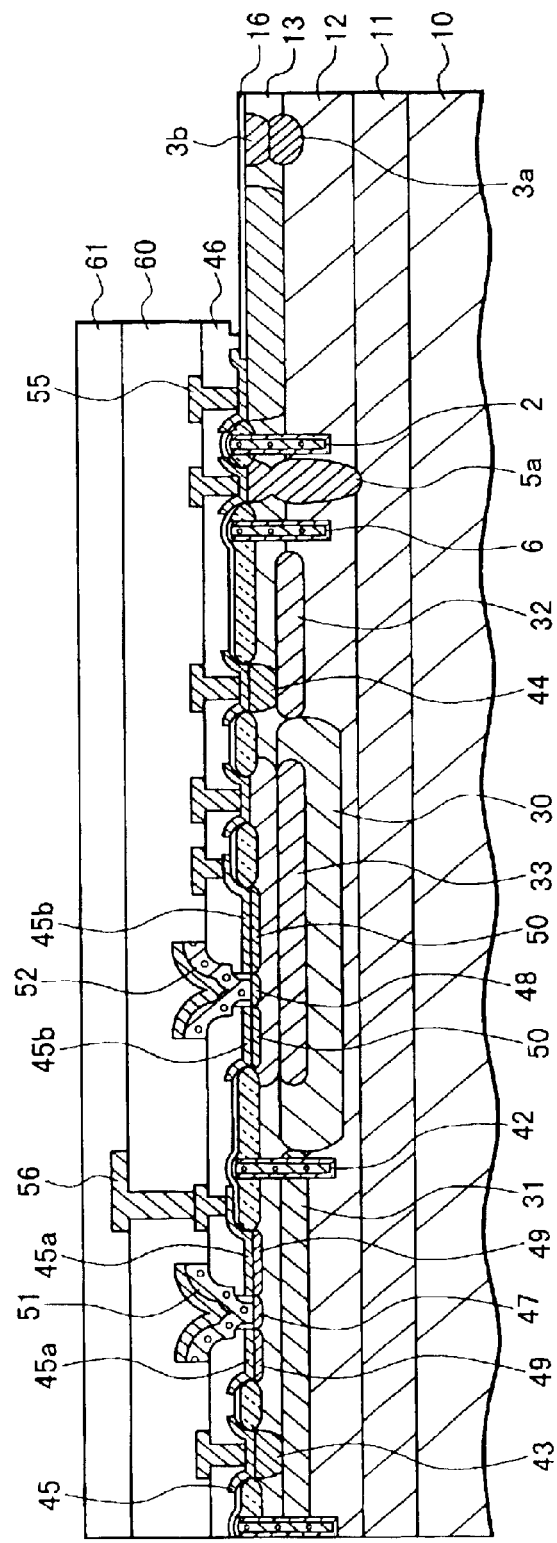

As shown in FIG. 10G, an opening is formed through the three layers from the cover film 61 to first layer interlayer insulating film 46 in the photodiode light reception area. At this time, the first polysilicon film 45 covering the surface of the antireflection film 16 serves as an etching stopper. After the opening is formed, the polysilicon film 45 on the antireflection layer 16 is removed.

With this manufacture method, the lower separation region 3a is formed at the same time when the p-type buried diffusion region 33 is formed. The upper anode lead region 5b is formed at the same time when the p-type well 35 is formed. An increase in the number of manufacture processes can therefore be suppressed as much as possible.

The present invention has been described in connection with the preferred embodiments. The invention is not limited only to the above embodiments. It is apparent that various modifications, improvements, combinations, and the like can be made by those skilled in the art.

What is claimed is:

1. A semiconductor device comprising:
   an underlying substrate having at least a surface layer made of semiconductor of a first conductivity type;
   a first layer formed on or over said surface layer of said underlying substrate and made of semiconductor having a resistance higher than a resistance of the surface layer of said underlying substrate;
   a first impurity diffusion region formed in a partial surface region of said first layer and doped with impurities of a second conductivity type opposite to the first conductivity type, said first impurity diffusion region not reaching a surface of said underlying substrate;
   a second impurity diffusion region of the first conductivity type disposed in said first layer and spaced apart from said first impurity diffusion region by a certain distance in an in-plane direction, said second impurity diffusion region reaching the surface of said underlying substrate; and
   a first separation region disposed between said first and second impurity diffusion regions, wherein a trench is formed in said first layer, and wherein dielectric material is disposed at least in a partial internal region of the trench.

2. A semiconductor device according to claim 1, further comprising an antireflection film formed at least on a partial surface region of said first impurity diffusion region.

3. A semiconductor device according to claim 1, further comprising electrodes for applying a reverse bias voltage to said first and second impurity diffusion regions.

4. A semiconductor device according to claim 1, wherein said first layer comprises a first lower layer and a first upper layer formed on the first lower layer, the first lower layer being located from the first upper layer to the underlying substrate side and being made of semiconductor of the first conductivity type, and having an impurity concentration lower than an impurity concentration of the surface layer of said underlying substrate of the first conductivity type.

5. A semiconductor device according to claim 4, wherein said first separation region reaches a position deeper than a boundary between the first upper and lower layers.

6. A semiconductor device according to claim 4, wherein:
   said first separation region does not reach an interface between said first layer and said underlying substrate; and
   a high impurity concentration region of the first conductivity type having an impurity concentration higher than an impurity concentration of a region just under said first impurity diffusion region is fanned in said first layer on the bottom of said first separation region, said high impurity concentration region being disposed in the first lower layer and not reaching the first upper layer.

7. A semiconductor device according to claim 1, further comprising:
   a third impurity diffusion region disposed in said first layer adjacent to said first impurity diffusion region, spaced apart from said first and second impurity diffusion regions by a certain distance in the in-plane direction, and doped with impurities of the second conductivity type, said third impurity diffusion region not reaching the surface of said underlying substrate; and
   a second separation region disposed in said first layer between said first and third impurity diffusion regions, said second separation region electrically separating said first and third impurity diffusion regions, wherein said first separation region is disposed also between said second and third impurity diffusion regions.

8. A semiconductor device according to claim 7, wherein said second separation region comprises a region doped with impurities of the first conductivity type.

9. A semiconductor device according to claim 8, wherein said second separation region is in contact with said first separation region.

10. A semiconductor device according to claim 9, wherein a region in contact with the first separation region, of the second separation region, is doped with impurities of the first conductivity type in addition to impurity implantation for forming said second separation region.

11. A semiconductor device according to claim 8, wherein said second separation region reaches said second impurity diffusion region and said first separation region abuts on a side wall of said second separation region.

12. A semiconductor device according to claim 7, wherein said second separation region includes a trench formed in said first layer and dielectric material disposed at least in a partial internal region of the trench.

13. A semiconductor device according to claim 12, wherein the trench constituting said second separation region is branched from the trench constituting said first separation region.

14. A semiconductor device according to claim 7, wherein said first separation region is disposed continuously from a region between said first and second impurity diffusion regions to a region between said third and second impurity diffusion regions, and said second separation region abuts of a side wall of said first separation region.

15. A semiconductor device according to claim 1, wherein said first separation region comprises a plurality of divisions disposed in a direction in which said first and second impurity diffusion regions are separated, each of the divisions comprising a trench formed in said first layer and dielectric material disposed at least in a partial internal region of the trench.

16. A semiconductor device according to claim 1, wherein said first separation region is disposed spaced apart from said second impurity diffusion region.

17. A semiconductor device according to claim 1, further comprising a bipolar transistor formed in and on a surface layer of said first layer, said bipolar transistor comprising a collector region formed in said first layer, a base region disposed between the collector region and an upper surface of said first layer and contacting the collector region and the first layer, and an emitter region disposed on the base region and made of impurity doped polysilicon.

18. A semiconductor device comprising:

an underlying substrate having at least a surface layer made of semiconductor of a first conductivity type;

a first layer formed on said surface layer of said underlying substrate and made of semiconductor having a resistance higher than a resistance of the surface layer of said underlying substrate;

a first impurity diffusion region formed in a partial surface region of said first layer and doped with impurities of a second conductivity type opposite to the first conductivity type, said first impurity diffusion region not reaching a surface of said underlying substrate;

a second impurity diffusion region of the first conductivity type disposed in said first layer and spaced apart from said first impurity diffusion region by a certain distance in an in-plane direction, said second impurity diffusion region reaching the surface of said underlying substrate;

a trench formed in said first layer, the trench surrounding a region in which said first and second impurity diffusion regions are disposed; and a dielectric material member disposed at least in a partial internal region of said trench.

* * * * *